United States Patent
Ang et al.

(10) Patent No.: US 7,122,465 B1
(45) Date of Patent: Oct. 17, 2006

(54) METHOD FOR ACHIEVING INCREASED CONTROL OVER INTERCONNECT LINE THICKNESS ACROSS A WAFER AND BETWEEN WAFERS

(75) Inventors: Boon-Yong Ang, Cupertino, CA (US); Cinti Xiaohua Chen, Fremont, CA (US); Simon S. Chan, Saratoga, CA (US); Inkuk Kang, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/003,208

(22) Filed: Dec. 2, 2004

(51) Int. Cl.
  *H01L 21/4763* (2006.01)
(52) U.S. Cl. ............ 438/633; 438/687; 438/692; 257/E21.304
(58) Field of Classification Search ............ 438/687, 438/633, 691, 692, 693, 631, 634, 638, 622, 438/623, 627, 643, 636, 637, 648, 653, 656, 438/672, 685, 902
  See application file for complete search history.

(56) References Cited

U.S. PATENT DOCUMENTS

| | | | |
|---|---|---|---|
| 5,637,185 A * | 6/1997 | Murarka et al. ............ 438/5 |
| 5,962,342 A * | 10/1999 | Chuang et al. ............ 438/692 |
| 6,100,184 A * | 8/2000 | Zhao et al. ............ 438/638 |
| 6,489,240 B1 * | 12/2002 | Iacoponi et al. ............ 438/687 |
| 6,514,858 B1 * | 2/2003 | Hause et al. ............ 438/640 |
| 6,660,649 B1 * | 12/2003 | Dao et al. ............ 438/717 |
| 6,813,031 B1 * | 11/2004 | Poris et al. ............ 356/516 |
| 6,910,942 B1 * | 6/2005 | Dornfeld et al. ............ 451/5 |
| 2003/0166339 A1 * | 9/2003 | Thomas et al. ............ 438/692 |
| 2005/0057755 A1 * | 3/2005 | Johnson et al. ............ 356/446 |
| 2006/0040437 A1 * | 2/2006 | Sandhu et al. ............ 438/186 |

* cited by examiner

Primary Examiner—Asok K. Sarkar
Assistant Examiner—Victor V. Yevsikov
(74) Attorney, Agent, or Firm—Farjami & Farjami LLP

(57) ABSTRACT

According to one exemplary embodiment, a method comprises a step of etching a trench in an ILD layer, said trench having sidewalls and a bottom surface. The method further comprises determining a height of the sidewalls of the trench. The method further comprises filling the trench with interconnect metal such the interconnect metal extends above the trench. According to this exemplary embodiment, the method further comprises performing a CMP process to remove a portion of the interconnect metal. In the present invention, the height of the sidewalls of the trench is utilized to control an amount of polishing performed in the CMP process. The remaining portion of interconnect metal in the trench forms an interconnect line, where the thickness of the interconnect line is controlled by utilizing the height of the sidewalls of the trench to control the amount of polishing in the CMP process.

20 Claims, 4 Drawing Sheets

METHOD FOR ACHIEVING INCREASED CONTROL OVER INTERCONNECT LINE THICKNESS ACROSS A WAFER AND BETWEEN WAFERS

TECHNICAL FIELD

The present invention is generally in the field of semiconductor fabrication. More specifically, the present invention is in the field of fabrication of copper interconnect lines.

BACKGROUND ART

Decreasing size and increasing functionality of consumer electronic devices, such as wireless communication devices, fuel an increasing demand for reliable integrated circuits ("IC") with larger scale of integration, higher device density, lower power consumption and faster speed. However, ICs having increased scale of integration, density, and speed and decreased power consumption also require highly conductive and reliable interconnect lines. Consequently, copper has become more desirable as a replacement for aluminum in interconnect lines, since copper has a lower resistance, i.e. it is more conductive, compared with aluminum. The lower resistance of copper enables signals in the IC to move faster by decreasing the RC time delay in the IC's interconnect lines. Furthermore, since copper has a higher electromigration resistance compare to aluminum, copper interconnect lines can reliably handle higher current densities with thinner lines.

Copper interconnect lines can be fabricated by using copper damascene interconnect technology. In current copper damascene interconnect technology, a trench can be etched in an interlayer dielectric ("ILD") film stack, and the sidewalls and bottom surface of the trench can be covered with a barrier metal, such as tantalum, which prevents copper from diffusing into the ILD film stack. Copper is then filled into the trench by electrochemical plating, and then a chemical mechanical polish ("CMP") process can be used to remove excess copper and the barrier metal and provide a substantially planar surface over the copper-filled trench, which forms an interconnect line.

However, due to ILD film stack thickness variations and non-uniformity in the CMP process, the copper thickness can vary significantly from wafer to wafer and can also vary across the wafer after the CMP process. As a result, copper interconnect resistance, which is critical in many types of circuits, such as analog, digital, and speed sensitive circuits, can undesirably vary across the wafer and from wafer to wafer.

Thus, there is a need in the art for a method for reducing undesirable variations in copper interconnect thickness across a wafer and between wafers.

SUMMARY

The present invention is directed to method for achieving increased control over interconnect line thickness across a wafer and between wafers. The present invention addresses and resolves the need in the art for a method for reducing undesirable variations in copper interconnect thickness across a wafer and between wafers.

According to one exemplary embodiment, a method comprises a step of etching a trench in an ILD layer, said trench having sidewalls and a bottom surface. For example, the ILD layer can comprise a top dielectric layer and a bottom dielectric layer, where the top dielectric layer may be TEOS oxide and the bottom dielectric layer may be silicon nitride. The method further comprises determining a height of the sidewalls of the trench. The method can further comprise depositing a barrier layer on the sidewalls and bottom surface of the trench and on the ILD stack. The method further comprises filling the trench with interconnect metal such the interconnect metal extends above the trench. The interconnect metal can be copper, for example.

According to this exemplary embodiment, the method further comprises performing a CMP process to remove a portion of the interconnect metal. In the present invention, the height of the sidewalls of the trench is utilized to control an amount of polishing performed in the CMP process. The remaining portion of interconnect metal in the trench forms an interconnect line, where the thickness of the interconnect line is controlled by utilizing the height of the sidewalls of the trench to control the amount of polishing in the CMP process. Other features and advantages of the present invention will become more readily apparent to those of ordinary skill in the art after reviewing the following detailed description and accompanying drawings.

DETAILED DESCRIPTION OF THE INVENTION

The present invention is directed to method for achieving increased control over interconnect line thickness across a wafer and between wafers. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

The present invention involves a process for utilizing trench sidewall height to control a subsequent CMP process and thereby control an amount of interconnect metal that is removed in the CMP process. As will be discussed in detail below, the present invention achieves an innovative process whereby variations in interconnect line thickness across a wafer and between wafers can be reduced. It is noted that although a single damascene process is utilized to illustrate the invention, the present invention also applies to a dual damascene process.

Figure 1:
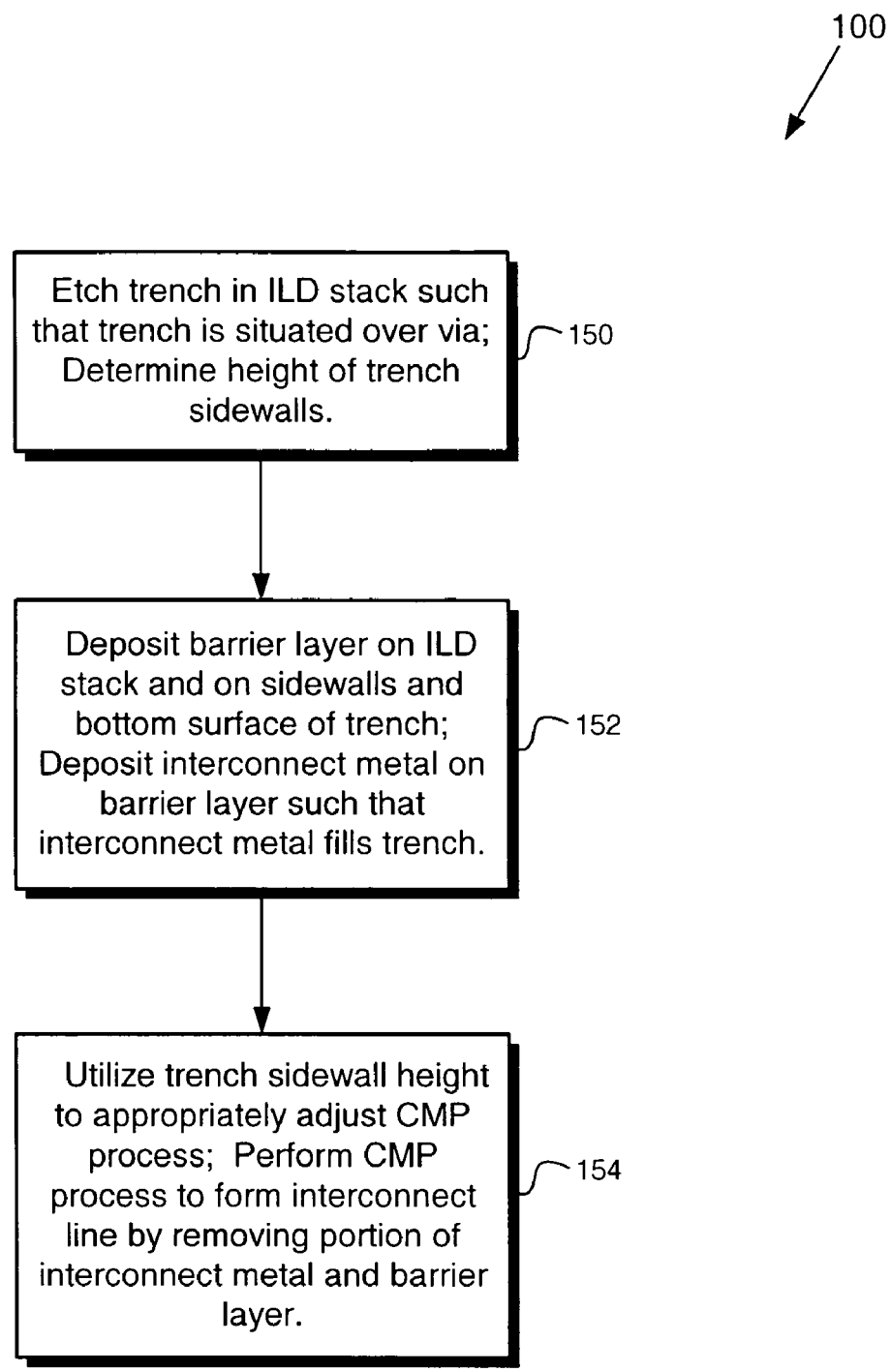
FIG. 1 is a flowchart corresponding to exemplary method steps according to one embodiment of the present invention.

FIG. 1 shows a flowchart illustrating an exemplary method according to an embodiment of the present invention. Certain details and features have been left out of flowchart 100 that are apparent to a person of ordinary skill in the art. For example, a step may consist of one or more substeps or may involve specialized equipment or materials, as known in the art. Steps 150 through 154 indicated in flowchart 100 are sufficient to describe one embodiment of the present invention, other embodiments of the invention may utilize steps different from those shown in flowchart 100. It is noted that the processing steps shown in flowchart 100 are performed on a wafer, which, prior to step 150, includes a semiconductor structure. In particular, the wafer includes a second ILD layer situated over a first ILD layer, which includes a metal-filled via.

Figure 2A:
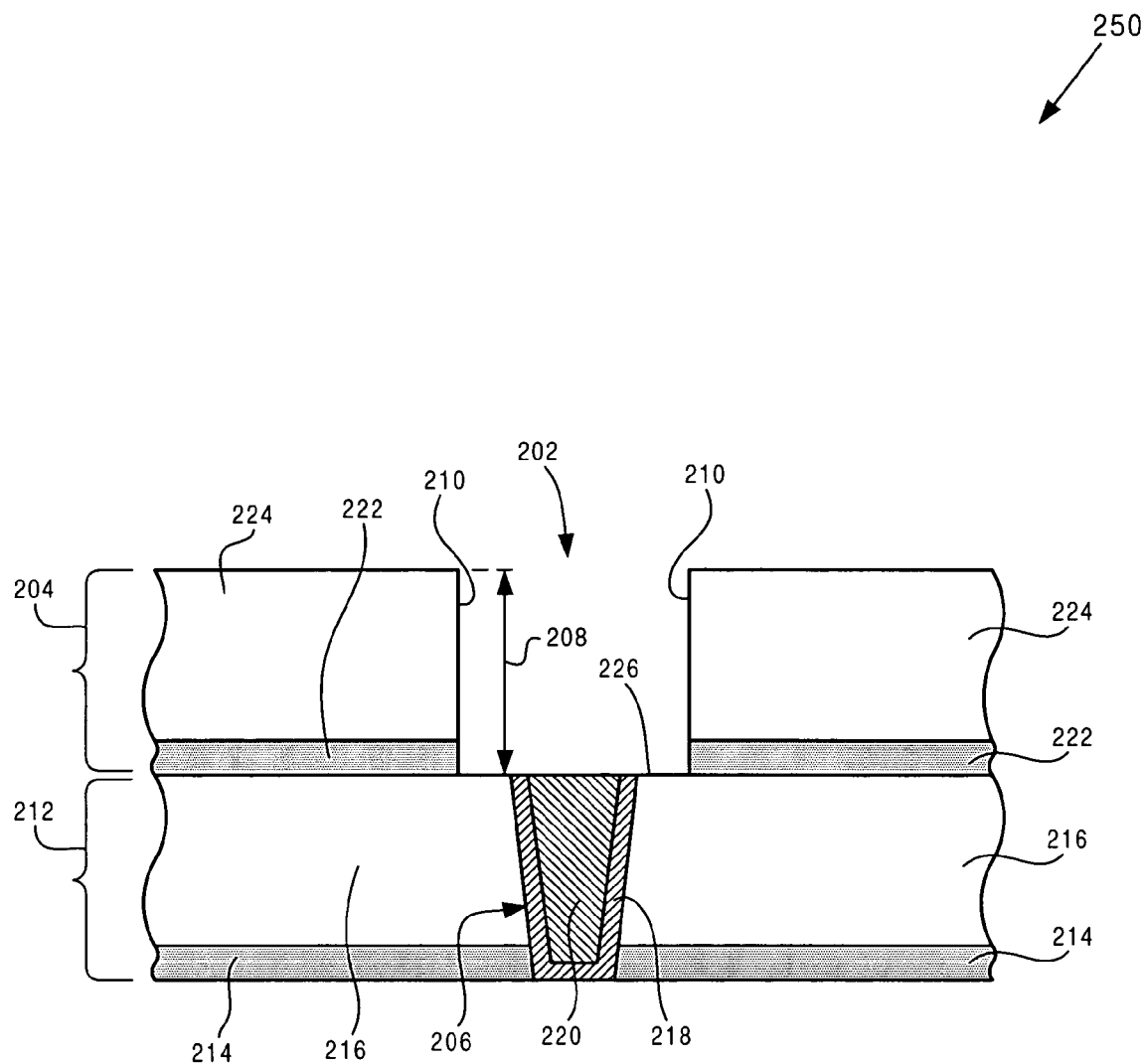
FIG. 2A illustrates a cross-sectional view of a portion of a wafer processed according to an embodiment of the invention, corresponding to certain steps of the flowchart in FIG. 1.
Figure 2B:
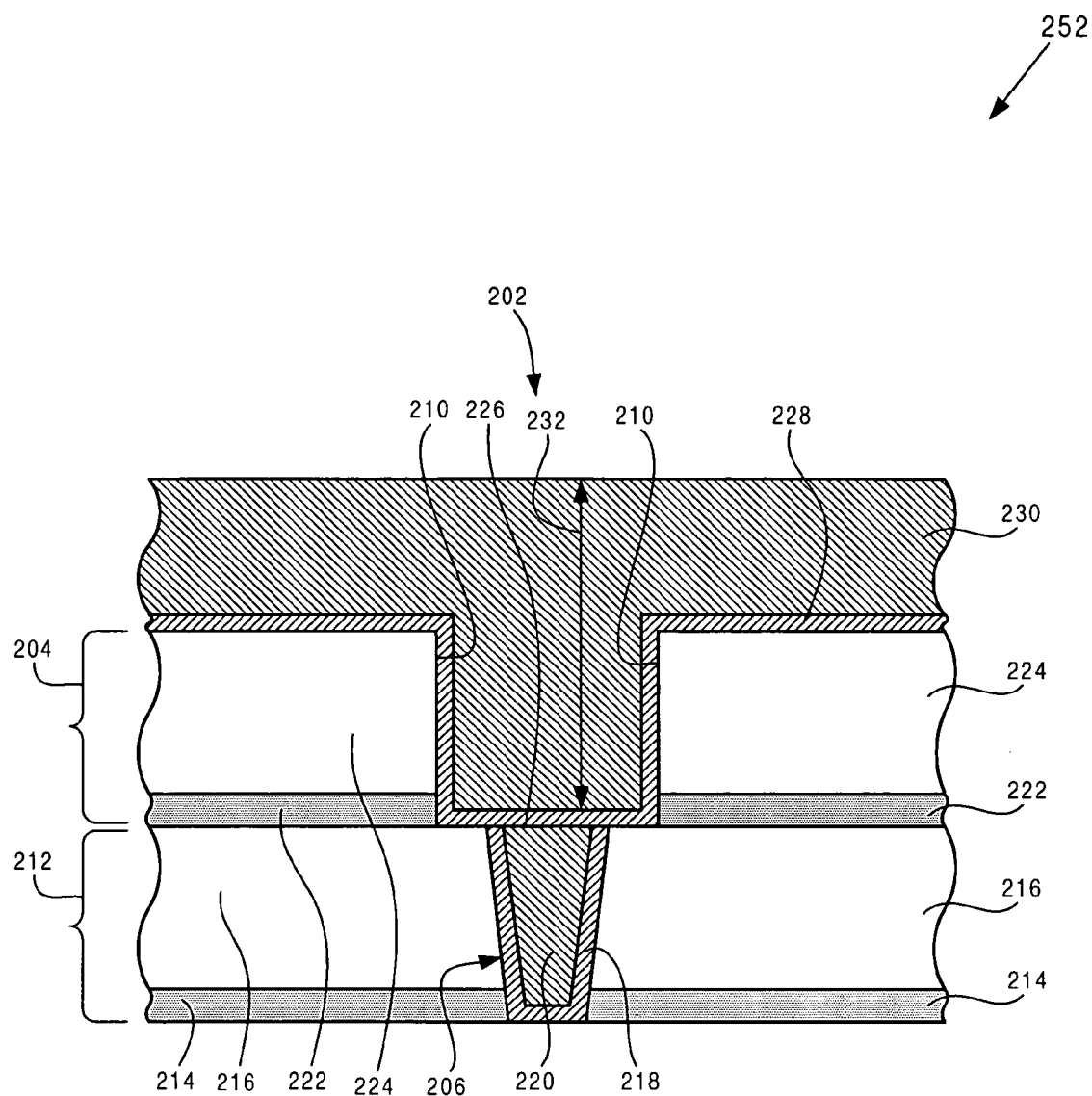
FIG. 2B illustrates a cross-sectional view of a portion of a wafer processed according to an embodiment of the invention, corresponding to certain steps of the flowchart in FIG. 1.
Figure 2C:
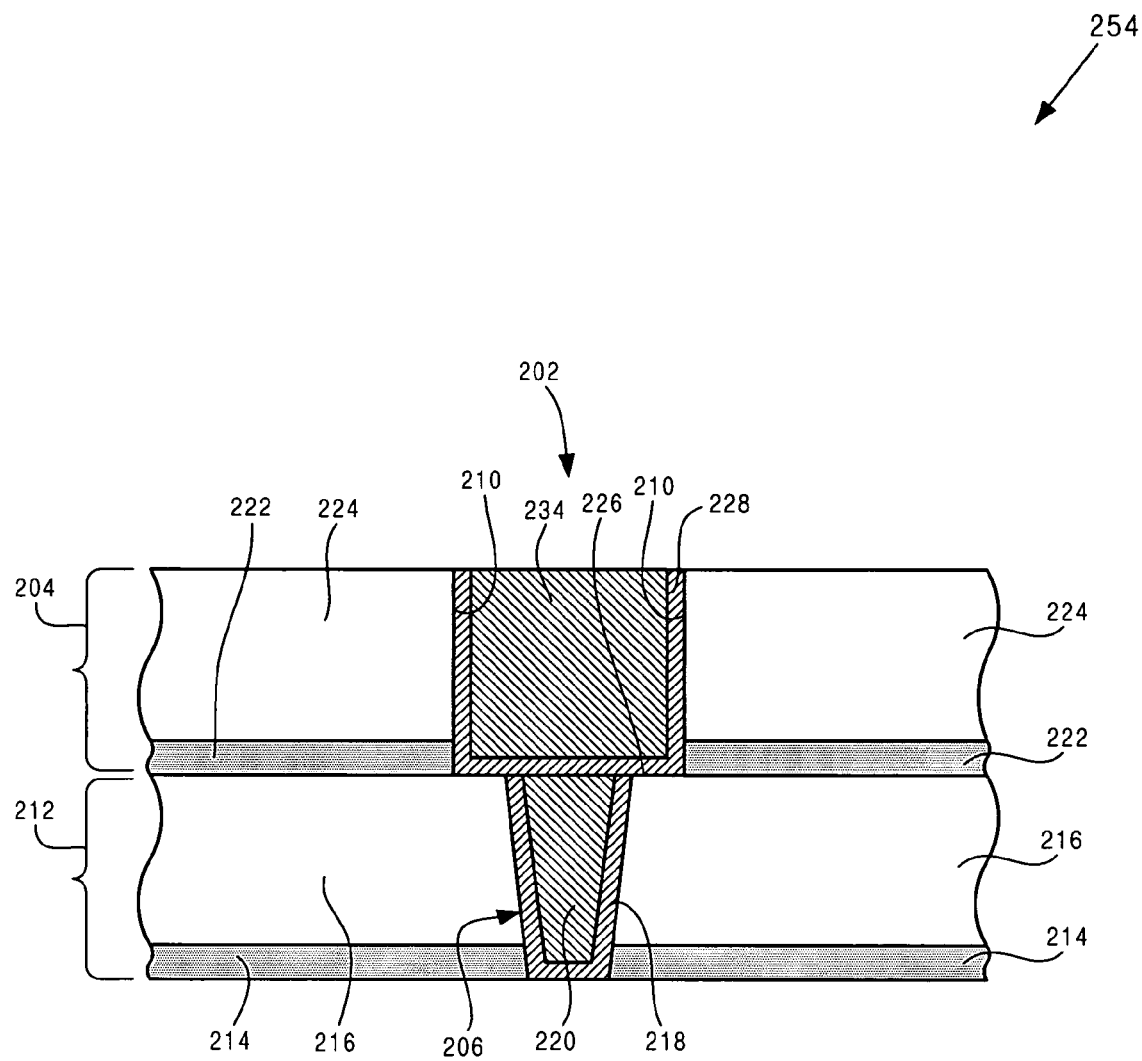
FIG. 2C illustrates a cross-sectional view of a portion of a wafer processed according to an embodiment of the invention, corresponding to certain steps of the flowchart in FIG. 1.

Moreover, structures 250, 252, and 254 in FIGS. 2A, 2B, and 2C illustrate the result of performing, on the structure including first and second ILD layer and metal-filled via discussed above, steps 150, 152, and 154 of flowchart 100, respectively. For example, structure 250 shows the structure discussed above after processing step 150, structure 252 shows structure 250 after the processing of step 152, and structure 254 shows structure 252 after the processing of step 154.

Referring now to step 150 in FIG. 1 and structure 250 in FIG. 2A, at step 150 of flowchart 100, trench 202 is etched in ILD layer 204 such that trench 202 is situated over via 206, and height 208 of sidewalls 210 of trench 202 is determined. As shown in FIG. 2A, ILD layer 212 includes bottom dielectric layer 214, which can be situated over a lower interconnect metal layer (not shown in FIG. 2A) of a semiconductor die, and top dielectric layer 216, which is situated on bottom dielectric layer 214. Bottom dielectric layer 214, which is an etch stop layer, can comprise silicon nitride or other appropriate dielectric and can be formed by using a chemical vapor deposition ("CVD") process. Top dielectric layer 216 can comprise tetraethylorthosilicate ("TEOS") oxide, fluorinated TEOS or other low-k dielectrics and can be formed by using a CVD process or other appropriate processes. By way of example, ILD layer 212 can have a thickness of between approximately 2500.0 Angstroms and approximately 4000.0 Angstroms.

Also shown in FIG. 2A, via 206 is situated in ILD layer 212 and includes barrier layer 218, which is situated on the sidewalls and bottom surface of via 206. Barrier layer 218 can comprise tantalum, tantalum nitride, or other appropriate barrier material and can be formed by a physical vapor deposition ("PVD") process or other appropriate processes. By way of example, barrier layer 218 can have a thickness of between approximately 150.0 Angstroms and approximately 300.0 Angstroms. Via 206 is filled with via metal 220, which can comprise copper. In other embodiments, via metal 220 can comprise tungsten or other appropriate metal.

Further shown in FIG. 2A, ILD layer 204 is situated over ILD layer 212 and includes bottom dielectric layer 222, which is situated on ILD layer 212, and top dielectric layer 224, which is situated on bottom dielectric layer 222. Bottom dielectric layer 222, which is an etch stop layer, can comprise silicon nitride or other appropriate dielectric and can be formed by using a CVD process or other appropriate processes. Top dielectric layer 224 can comprise TEOS oxide, silicon carbide, a low-k dielectric, or other appropriate dielectric and can be formed by using a CVD process or other appropriate processes. By way of example, ILD layer 204 can have a thickness of between approximately 2500.0 Angstroms and approximately 4000.0 Angstroms. Also shown in FIG. 2A, trench 202 is situated in ILD layer 204 and also situated over via 206. Trench 202 can be formed in ILD layer 204 by utilizing an appropriated etch process and includes sidewalls 210 and bottom surface 226. Sidewalls 210 of trench 202 have height 208, which can be determined by using a profilometer or other appropriate measuring device. Height 208 of trench 202 corresponds to the step height, i.e. the thickness, of ILD layer 204 and can be between approximately 2500.0 Angstroms and approximately 4000.0 Angstroms. In the present invention, height 208 will be utilized in a subsequent process step to control an amount of polishing performed in a CMP process. Referring to FIG. 2A, the result of step 150 of flowchart 100 is illustrated by structure 250.

Continuing with step 152 in FIG. 1 and structure 252 in FIG. 2B, at step 152 of flowchart 100, barrier layer 228 is deposited on ILD layer 204 and on sidewalls 210 and bottom surface 226 of trench 202 and interconnect metal 230 is deposited on barrier layer 228 such that interconnect metal 230 fills trench 202 and extends above trench 202. Barrier layer 228 can comprise tantalum, tantalum nitride, or other appropriate barrier material and can be deposited on ILD layer 204 and on sidewalls 210 and bottom surface 226 of trench 202 by using a PVD process or other appropriate processes. By way of example, barrier layer 228 can have a thickness of between approximately 150.0 Angstroms and approximately 300.0 Angstroms. In the present embodiment, interconnect metal 230 comprises copper and can be deposited on barrier layer 228 by using an electroplating process or other appropriate processes. Interconnect metal 230 has thickness 232, which can be between approximately 7000.0 Angstroms and approximately 8500.0 Angstroms. Referring to FIG. 2B, the result of step 152 of flowchart 100 is illustrated by structure 252.

Continuing with step 154 in FIG. 1 and structure 254 in FIG. 2C, at step 154 of flowchart 100, height 208 of sidewalls 210 of trench 202 is utilized to appropriately adjust a CMP process and the CMP process is performed to form interconnect line 234 by removing a portion of interconnect metal 230 and barrier layer 228. In the present invention, height 208 (shown in FIG. 2A) of sidewalls 210 of trench 202 is incorporated into a CMP recipe and utilized to control the amount of polishing performed in the CMP process. For example, if height 208 is at the higher end of a predetermined range, more polishing is performed during the CMP process, whereas if height 208 (shown in FIG. 2A) is at the lower end of the predetermined range, less polishing is performed. In the CMP process, which has been appropriately adjusted by height 208, a portion of interconnect metal 230 (shown in FIG. 2B) situated over ILD layer 204 and over trench 202 and a portion of barrier layer 228 situated over ILD layer 204 are removed such that the remaining portion of interconnect metal 230 forms interconnect line 234.

Thus, since height 208, i.e. the step height of ILD layer 204, is utilized to control the amount of polishing in the CMP process and, consequently, the amount of interconnect metal that is removed during the CMP process, height 208 also controls the thickness of interconnect line 234. Thus, height 208, i.e. the step height of ILD layer 204, can be used by the present invention to control the thickness of any number of interconnect lines, such as interconnect line 234, which can be formed across the wafer. As a result, the present invention advantageously achieves interconnect lines, such as interconnect line 234, having reduced thickness variations, i.e. more uniform thickness across the wafer. Furthermore, the present invention advantageously achieves reduced thickness variations in interconnect lines between wafers. Thus, by incorporating trench sidewall height in a CMP process to reduce interconnect line thickness variations across the wafer and between wafers, the present invention advantageously achieves a corresponding reduction in interconnect line resistance variations across the wafer and between wafers.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, method for achieving increased control over interconnect line thickness across a wafer and between wafers has been described.

The invention claimed is:

1. A method comprising steps of:
   etching a trench in an ILD layer, said trench having sidewalls and a bottom surface;
   determining a height of said sidewalls of said trench;
   filling said trench with interconnect metal such that said interconnect metal extends above said trench;
   performing a CMP process to remove a portion of said interconnect metal;
   wherein said height of said sidewalls of said trench is used to adjust said CMP process to control an amount of polishing performed in said CMP process.

2. The method of claim 1 further comprising a step of depositing a barrier layer on said sidewalls and said bottom surface of said trench and on said ILD stack after said step of determining said height of said sidewalls of said trench and prior to said step of filling said trench with said interconnect metal.

3. The method of claim 2 wherein said step of filling said trench with said interconnect metal comprises depositing said interconnect metal on said barrier layer.

4. The method of claim 1 wherein said interconnect metal comprises copper.

5. The method of claim 1 wherein a remaining portion of said interconnect metal in said trench forms an interconnect line.

6. The method of claim 5 wherein a thickness of said interconnect line is controlled by utilizing said height of said sidewalls of said trench to control said amount of polishing in said CMP process.

7. The method of claim 1 wherein said ILD layer comprises a top dielectric layer and a bottom dielectric layer, said top dielectric layer comprising TEOS oxide.

8. The method of claim 7 wherein said bottom dielectric layer comprises silicon nitride.

9. A method comprising steps of:
   etching a trench in an ILD layer, said trench having sidewalls and a bottom surface;
   determining a height of said sidewalls of said trench;
   depositing a barrier layer on said sidewalls and said bottom surface of said trench and on said ILD layer;
   depositing interconnect metal on said barrier layer such that said interconnect metal fills said trench;
   performing a CMP process to remove a portion of said interconnect metal;
   wherein said height of said sidewalls of said trench is used to adjust said CMP process to control an amount of polishing performed in said CMP process.

10. The method of claim 9 wherein said interconnect metal comprises copper.

11. The method of claim 9 wherein a remaining portion of said interconnect metal in said trench forms an interconnect line.

12. The method of claim 11 wherein a thickness of said interconnect line is controlled by utilizing said height of said sidewalls of said trench to control said amount of polishing performed in said CMP process.

13. The method of claim 9 wherein said ILD layer comprises a top dielectric layer and a bottom dielectric layer, said top dielectric layer comprising TEOS oxide.

14. The method of claim 13 wherein said bottom dielectric layer comprises silicon nitride.

15. The method of claim 9 wherein said step of performing said CMP process comprises removing a portion of said barrier layer situated on said ILD layer.

16. A method comprising steps of:
   etching a trench in an ILD layer, said trench having sidewalls and a bottom surface;
   determining a height of said sidewalls of said trench;
   depositing a barrier layer on said sidewalls and said bottom surface of said trench and on said ILD layer;
   depositing interconnect metal on said barrier layer such that said interconnect metal fills said trench;
   performing a CMP process to remove a portion of said interconnect metal such that a remaining portion of said interconnect metal forms an interconnect line;
   wherein said height of said sidewalls of said trench is used to adjust said CMP process to control an amount of polishing performed in said CMP process and to control a thickness of said interconnect line.

17. The method of claim 16 wherein said interconnect metal comprises copper.

18. The method of claim 16 wherein said step of performing said CMP process comprises removing a portion of said barrier layer situated on said ILD layer.

19. The method of claim 16 wherein said ILD layer comprises a top dielectric layer and a bottom dielectric layer, said top dielectric layer comprising TEOS oxide.

20. The method of claim 19 wherein said bottom dielectric layer comprises silicon nitride.

* * * * *